United States Patent [19]

Kalnitsky

[11] Patent Number: 5,470,793
[45] Date of Patent: Nov. 28, 1995

[54] METHOD OF VIA FORMATION FOR THE MULTILEVEL INTERCONNECT INTEGRATED CIRCUITS

[75] Inventor: Alexander Kalnitsky, Dallas, Tex.

[73] Assignee: SGS-Thomson Microelectronics, Inc., Carrollton, Tex.

[21] Appl. No.: 329,767

[22] Filed: Oct. 27, 1994

Related U.S. Application Data

[63] Continuation of Ser. No. 36,229, Mar. 24, 1993, abandoned, which is a continuation of Ser. No. 726,792, Jun. 28, 1991, abandoned.

[51] Int. Cl.$^6$ .................. H01L 21/283; H01L 21/311
[52] U.S. Cl. .................. 437/195; 437/228; 437/241; 437/947; 437/978; 156/653.1
[58] Field of Search .................. 437/195, 228, 437/241, 947, 978, 981, 982; 156/651, 652, 653, 657, 653.1, 644.1; 216/18

[56] References Cited

U.S. PATENT DOCUMENTS

| | | |
|---|---|---|
| 4,372,034 | 2/1983 | Bohr . |
| 4,466,172 | 8/1984 | Batra .................. 437/41 |
| 4,686,100 | 8/1987 | Heath et al. .................. 437/241 |
| 4,775,550 | 10/1988 | Chu et al. .................. 437/228 |
| 4,832,789 | 5/1989 | Cochran et al. . |
| 5,063,716 | 11/1991 | Lee et al. .................. 437/195 |

FOREIGN PATENT DOCUMENTS

| | | |
|---|---|---|
| 0200525 | 11/1986 | European Pat. Off. . |
| 1-45120 | 2/1989 | Japan .................. 437/981 |
| 3-32026 | 2/1991 | Japan .................. 437/981 |

Primary Examiner—T. N. Quach
Attorney, Agent, or Firm—Kenneth C. Hill; Lisa K. Jorgenson; Richard K. Robinson

[57] ABSTRACT

A method is provided for depositing a silicon nitride layer to protect and isolate underlying layers during wet etching. The silicon nitride layer maintains the integrity of interconnect leads, bond pads, and die boundaries by acting as a wet etch stop. The silicon nitride layer stops the chemicals used in a wet etch from reaching underlying layers in the integrated circuit.

4 Claims, 2 Drawing Sheets

METHOD OF VIA FORMATION FOR THE MULTILEVEL INTERCONNECT INTEGRATED CIRCUITS

The present application is a continuation of Ser. No. 08/036,229, filed Mar. 24, 1993, now abandoned, which is a continuation of Ser. No. 07/726,792, filed Jun. 28, 1992, now abandoned.

BACKGROUND OF THE INVENTION

1. Field of the Invention

The present invention relates generally to semiconductor integrated circuits, and more specifically to a method of protecting underlying dielectric and metal layers during wet etch by depositing silicon nitride layers.

2. Description of the Prior Art

In semiconductor integrated circuits, formation of interconnect layers is important to the proper operation of these devices. Interconnect signal lines make contact to lower conductive layers of the integrated circuit through vias in an insulating layer. For best operation of the device, the lower conductive layers should not be damaged during formation of the contact via.

Various interlevel dielectric layers are deposited on the integrated circuit during formation of the device. These layers separate the conductive layers from each other. One way to form contact vias through these insulating layers is by a process which utilizes both an isotropic wet etch and an anisotropic plasma etch. A wet etch is performed by exposing the integrated circuit to liquid chemicals, such as hydrogen fluoride. After a via has been opened part way through the insulating layer, an anisotropic etch is performed to expose the underlying conductive layer.

During a wet etch, undesirable voids, defects or stressed regions in a dielectric layer allow the chemicals to travel through the dielectric layers to the underlying conductive layers. This causes some of the conductive material to be etched away, leaving spots where conductive material in a conductive layer is missing. An integrated circuit with missing conductive material is unreliable, and possibly non-functional.

An approach presently used to minimize the possibility of conductive material being etched away is to reduce the period of time allocated for wet etching. This minimizes the likelihood that the underlying conductor will be damaged. However, decreasing the wet etch time also decreases the metal step coverage improvement realized by using a partial wet etch.

The problems caused during a wet etch by chemicals etching material not intended to be removed is not limited to conductive interconnect layers. Mouse bites in die boundaries and holes in bond pads are also attributed to the attack of metal during the formation of vias by wet etching.

It would be desirable to provide a technique to incorporate a layer of material in the interlevel dielectric layers which would act as a wet etch stop during via formation.

SUMMARY OF THE INVENTION

It is therefore an object of the present invention to provide a method for forming a contact via without damaging underlying conductive layers.

It is another object of the present invention to protect underlying conductive layers from damage caused by wet etching of interlevel dielectric layers.

It is a further object of the present invention to provide such a method and structure which is compatible with standard process flows, and which adds minimal additional complexity to the fabrication of a typical integrated circuit.

Therefore, according to the present invention, a method of via formation for multilevel interconnect integrated circuits includes the depositing of a conformal layer of silicon nitride over the device before depositing the topmost layer of an interlevel oxide insulating layer. During the formation of contact vias through the combined oxide and nitride layers, a wet etch is performed. The nitride layer isolates the underlying dielectric and conductive layers from chemicals used in the wet etch, thereby maintaining the integrity of those underlying conductive and dielectric layers even if defects exist in the oxide layer.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
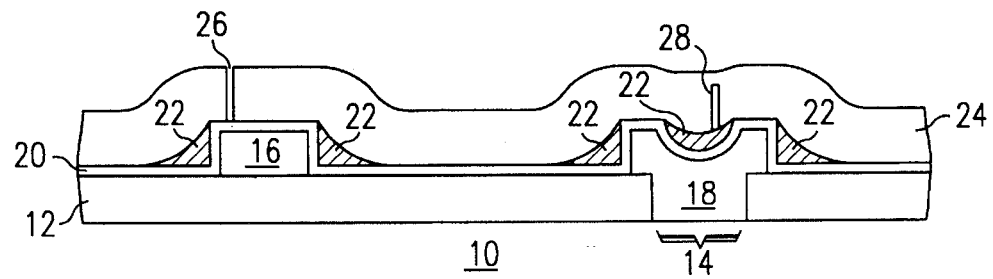
FIGS. 1 and 2 illustrate problems encountered when forming contact vias using prior art techniques.
Figure 2:
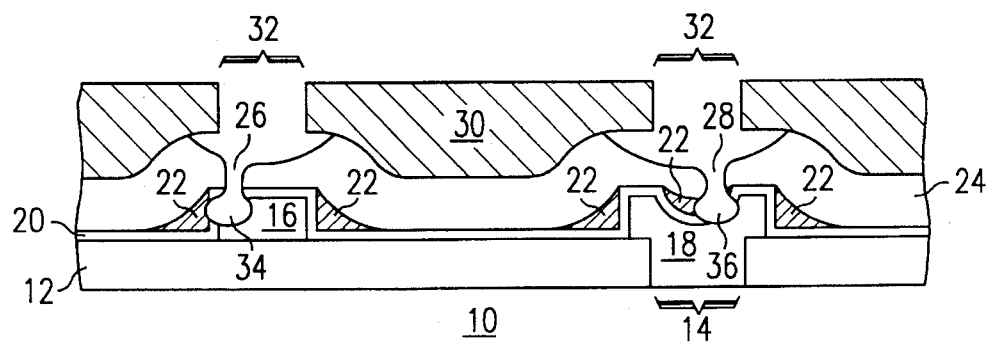

Referring to FIGS. 1 and 2, a method for forming contact vias according to prior art techniques is shown. In FIG. 1 an integrated circuit device is formed in and on an underlying region 10. Conductive region 10 represents underlying circuitry as known in the art, and the details are not relevant to the present invention. A conformal interlevel dielectric layer 12 is deposited over the surface of the integrated circuit, where a contact via 14 is formed through the dielectric layer 12 using a mask and an etching technique known in the art. A conductive layer is deposited, defined and patterned on the integrated circuit to define interconnect leads 16, 18. The interconnect leads may be metal, such as aluminum, or it may be a silicided polycrystalline silicon layer. A layer of oxide 20 is deposited over the surface of the integrated circuit, followed by a layer of spin on glass.

Once deposited over the surface of the integrated circuit, the glass is then etched back using an anisotropic etch. This results in the formation of filler regions 22 along side steep side walls or inside lower topographical areas on the integrated circuit. Another conformal dielectric layer 24, such as oxide, is then deposited over the surface of the integrated circuit. This dielectric layer 24 may have voids 26, 28, in it, which are cracks or channels in the layer. A void 26 may run through the entire layer itself, or the void 28 may be located somewhere inside the layer. As will be shown, when the integrated circuit undergoes further processing, voids can create defects in the device. Stress regions on dielectric layer 24 will cause a smaller problem.

Referring to FIG. 2, a photoresist layer 30 is deposited and patterned on the integrated circuit. The photoresist layer 30 is used as a mask while the integrated circuit undergoes a wet etch. The wet etching technique is performed by exposing the integrated circuit to liquid chemicals, such as hydrogen fluoride, which selectively remove material from the device. The wet etch is used to create an opening 32 part way through the oxide layer 24. If the oxide layer 24 has voids 26, 28 in it, the chemicals used in the wet etch will etch through materials not intended to be removed and create defects 34, 36 in the integrated circuit.

Figure 3:
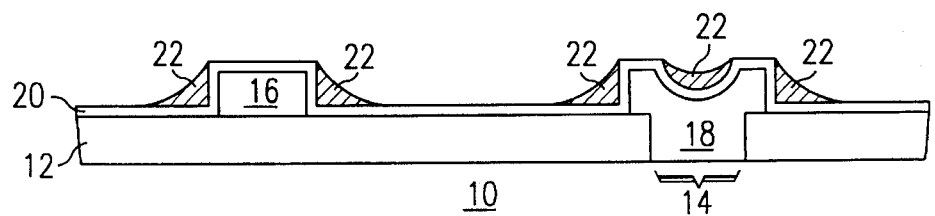
FIGS. 3–7 illustrate a preferred method of via formation for use with integrated circuits.

FIG. 3 illustrates a preferred technique according to the present invention which is used to create integrated circuits, as described above in reference to FIG. 1. This technique produces the underlying conductive region 10, an interlevel dielectric layer 12, a contact via 14, interconnect leads 16, 18, an oxide layer 20, and filler regions of glass 22 as described above.

Figure 4:
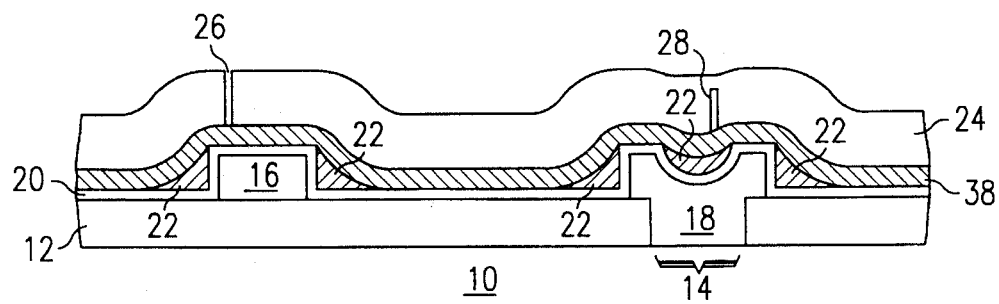

Referring to FIG. 4, a conformal layer of silicon nitride 38 is deposited over the surface of the integrated circuit. The silicon nitride layer 38 may be 100 to 2,000 angstroms thick. A conformal layer of dielectric 24 is then deposited over the surface of the device. Layer 24 is preferably an undoped CVD oxide layer. As shown in FIG. 4, the dielectric layer 24 contains voids 26, 28.

Figure 5:
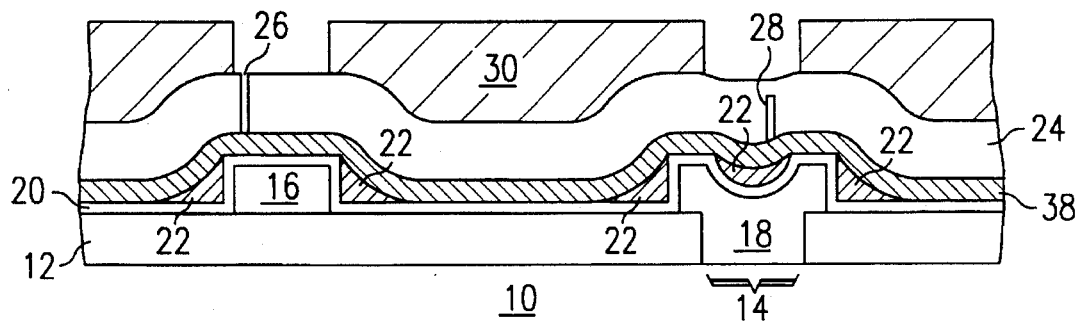

FIG. 5 illustrates the integrated circuit with a photoresist layer 30 deposited over the surface of the integrated circuit. The photoresist layer 30 is patterned and defined using methods known in the art.

Figure 6:
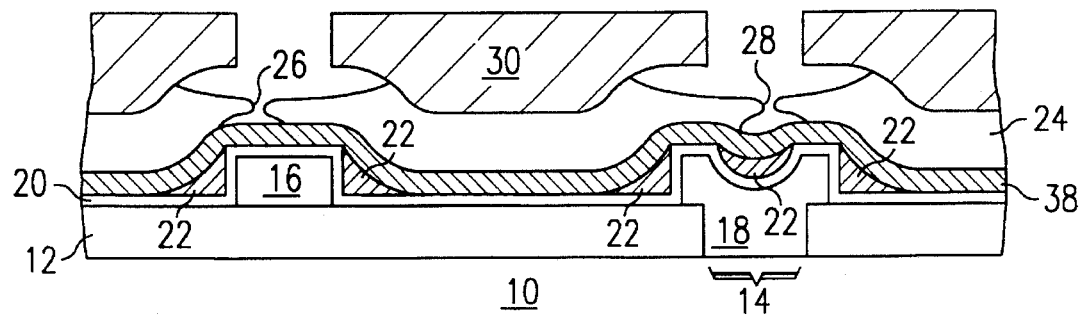

FIG. 6 illustrates the integrated circuit after a wet etch is performed part way through the dielectric layer 24. During the wet etch, chemicals will etch through the voids 26, 28 in the dielectric layer 24 and be stopped by the barrier of silicon nitride layer 38. The underlying layers of dielectric 20, glass 22, and interconnect leads 16, 18 are protected from accidental etching caused by the chemicals traveling through the voids 26, 28.

Figure 7:
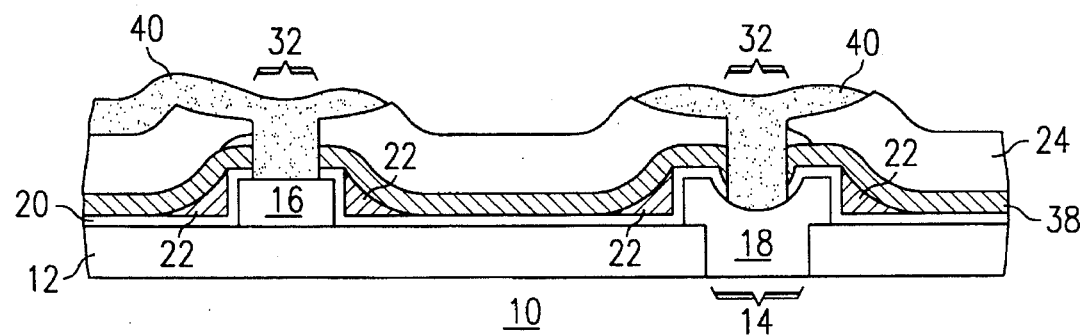

Referring to FIG. 7 an anisotropic etch is performed using photoresist 30 as a mask. This completes formation of the opening 32 to expose a portion of the interconnect leads 16, 18. FIG. 7 illustrates the integrated circuit with the photoresist layer 30 removed. Conductive material 40 is then deposited and patterned on the device making electrical contact with interconnect leads 16, 18.

As will be appreciated by those skilled in the art, the method described above provides for isolation of the insulating layers and interconnect leads 16, 18 during wet etching. Depositing a layer of silicon nitride 38 adds a minimal amount of complexity to the process flow, and is compatible with standard process flows currently in use. This technique allows for improved via formation in multilevel interconnect integrated circuits. This technique also can be used to make electrical contact to active regions within a substrate.

The period of time allocated for a wet etch can be varied to suit process requirements. For example, a thick silicon nitride layer and a thin overlying oxide layer may be deposited on an integrated circuit. A wet etch can be used to etch completely through the oxide layer, followed by an anisotropic etch to etch through the silicon nitride layer. Alternatively, a wet etch can be used to etch only part way through the oxide layer, with the anisotropic etch performed on the remaining oxide layer, silicon nitride layer, and any underlying layers in order to complete via formation.

While the invention has been particularly shown and described with reference to a preferred embodiment, it will be understood by those skilled in the art that various changes in form and detail may be made therein without departing from the spirit and scope of the invention.

What is claimed is:

1. A method for forming an integrated circuit contact structure, comprising the steps of:

forming a metal conductive element over a lower insulating layer;

forming a conformal oxide layer over said metal conductive element and said lower insulating layer;

forming a layer of spin on glass over said conformal oxide layer;

forming a barrier layer over said conformal oxide layer;

forming an insulating layer over said barrier layer, wherein the barrier layer is made of a material that is not etched by a wet etch that etches said insulating layer;

depositing and patterning a photoresist layer over said insulating layer;

performing a wet etch part way through the insulating layer in a region defined by the patterned photoresist layer, leaving a remainder of the insulating layer which is not etched through; and performing an anisotropic etch through the remainder of the insulating layer, the barrier layer, and the conformal oxide layer in the region defined by the patterned photoresist layer to expose a portion of the metal conductive element;

wherein the insulating layer has a crack in the region defined by the patterned photoresist layer, wherein the crack extends through the insulating layer to the barrier layer, and wherein, during the step of performing a wet etch, the barrier layer acts as an etch stop for etchant which moves through the crack.

2. The method of claim 1, wherein, before the step of depositing said barrier layer, the spin on glass layer is etched back to form filler regions to make the surface of the integrated circuit more nearly planar.

3. The method of claim 1, wherein said barrier layer is made of silicon nitride, and said inuslating layer is made of oxide.

4. The method of claim 2, wherein the spin on glass layer is etched back until it is entirely removed from above the metal conductive element.

\* \* \* \* \*